US012653071B2

(12) United States Patent (10) Patent No.: US 12,653,071 B2
Lee et al. (45) Date of Patent: Jun. 9, 2026

(54) SEMICONDUCTOR PACKAGE AND METHOD OF FABRICATING THE SAME

(71) Applicant: SAMSUNG ELECTRONICS CO., LTD., Suwon-si (KR)

(72) Inventors: Hyoungjoo Lee, Suwon-si (KR); Sang-Sick Park, Suwon-si (KR); Chungsun Lee, Suwon-si (KR); Seungyoon Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 412 days.

(21) Appl. No.: 18/213,018

(22) Filed: Jun. 22, 2023

(65) Prior Publication Data

US 2024/0170449 A1 May 23, 2024

(30) Foreign Application Priority Data

Nov. 18, 2022 (KR) ........................ 10-2022-0155555

(51) Int. Cl.
*H01L 23/00* (2006.01)
*H01L 25/065* (2023.01)

(52) U.S. Cl.
CPC .............. *H01L 24/83* (2013.01); *H01L 24/08* (2013.01); *H01L 24/09* (2013.01); *H01L 24/16* (2013.01); *H01L 24/32* (2013.01); *H01L 24/73* (2013.01); *H01L 24/81* (2013.01); *H01L 25/0652* (2013.01); *H01L 25/0657* (2013.01);
(Continued)

(58) Field of Classification Search
CPC ......... H01L 24/83; H01L 24/08; H01L 24/09; H01L 24/16
See application file for complete search history.

(56) References Cited

U.S. PATENT DOCUMENTS 7,170,185 B1 * 1/2007 Hogerton ................ H10F 24/27
257/E23.021
7,235,426 B2 * 6/2007 Tsai .................... H01L 21/3043
438/114
(Continued)

FOREIGN PATENT DOCUMENTS

CN 102956589 A * 3/2013 ......... H01L 23/3677
CN 207783252 U * 8/2018
(Continued)

OTHER PUBLICATIONS

Communication dated Mar. 19, 2026 issued by the Korean Ministry of Intellectual Property in Korean Patent Application No. 10-2022-0155555.

*Primary Examiner* — Laura M Menz
(74) *Attorney, Agent, or Firm* — Sughrue Mion, PLLC

(57) ABSTRACT

A method includes providing a first structure, forming a connection pad on the first structure, forming a preliminary connection member on the connection pad, forming an adhesion layer on the first structure, the adhesion layer covering the preliminary connection member, removing a portion of the adhesion layer to expose an exposure surface of the preliminary connection member, providing a second structure, forming a chip pad and a dummy pad on the second structure, and covering the chip pad and the dummy pad with the adhesion layer that has been formed on the first structure. A thickness of the dummy pad is greater than a thickness of the chip pad.

11 Claims, 7 Drawing Sheets

(52) U.S. Cl.
CPC ................. *H01L 2224/0801* (2013.01); *H01L 2224/0903* (2013.01); *H01L 2224/09517* (2013.01); *H01L 2224/16148* (2013.01); *H01L 2224/16225* (2013.01); *H01L 2224/32145* (2013.01); *H01L 2224/73204* (2013.01); *H01L 2224/81097* (2013.01); *H01L 2224/81203* (2013.01); *H01L 2224/83097* (2013.01); *H01L 2224/83203* (2013.01); *H01L 2225/06513* (2013.01); *H01L 2225/06524* (2013.01); *H01L 2225/06541* (2013.01); *H01L 2924/351* (2013.01)

(56) References Cited

U.S. PATENT DOCUMENTS

| | | | | |
|---|---|---|---|---|
| 9,373,526 | B2 * | 6/2016 | Hsu | H01L 23/49861 |
| 9,496,237 | B2 * | 11/2016 | Beer | H01L 24/03 |
| 9,721,926 | B2 * | 8/2017 | Choe | H01L 25/50 |
| 9,793,221 | B2 * | 10/2017 | Kira | H01L 24/14 |
| 10,008,467 | B2 * | 6/2018 | Lu | H01L 23/49894 |
| 11,270,977 | B2 * | 3/2022 | Jain | H01L 25/0657 |
| 11,309,246 | B2 * | 4/2022 | Dabral | H05K 1/181 |
| 11,342,310 | B2 * | 5/2022 | Choi | H01L 24/83 |
| 11,664,346 | B2 * | 5/2023 | Choi | H01L 23/562 |
| | | | | 257/690 |
| 11,784,168 | B2 * | 10/2023 | Choi | H01L 25/50 |
| | | | | 257/713 |
| 2005/0142696 | A1 * | 6/2005 | Tsai | H01L 23/3114 |
| | | | | 438/114 |
| 2006/0204650 | A1 * | 9/2006 | Hu | C23C 28/023 |
| | | | | 427/256 |
| 2007/0102827 | A1 * | 5/2007 | Hogerton | H01L 24/94 |
| | | | | 257/E21.503 |
| 2008/0083964 | A1 * | 4/2008 | Fujimoto | H10F 39/804 |
| | | | | 257/E31.127 |
| 2010/0308442 | A1 * | 12/2010 | Naka | H01L 24/11 |
| | | | | 257/E23.179 |
| 2012/0086111 | A1 * | 4/2012 | Iwamoto | H01L 24/83 |
| | | | | 257/E23.033 |
| 2014/0332946 | A1 * | 11/2014 | Oh | H01L 23/5384 |
| | | | | 257/686 |
| 2015/0333023 | A1 * | 11/2015 | Beer | H01L 24/05 |
| | | | | 257/766 |
| 2021/0384162 | A1 * | 12/2021 | Choi | H01L 24/83 |
| 2022/0068863 | A1 * | 3/2022 | Hong | H01L 21/561 |
| 2022/0278079 | A1 * | 9/2022 | Choi | H01L 24/83 |
| 2023/0395523 | A1 * | 12/2023 | Park | H01L 23/3135 |
| 2024/0071845 | A1 * | 2/2024 | Kim | H01L 24/16 |
| 2024/0072006 | A1 * | 2/2024 | Lee | H01L 25/50 |
| 2024/0105650 | A1 * | 3/2024 | Ahn | H01L 23/481 |
| 2024/0128218 | A1 * | 4/2024 | Chang | H01L 21/561 |
| 2024/0145360 | A1 * | 5/2024 | Park | H01L 23/5384 |
| 2024/0145366 | A1 * | 5/2024 | Oh | H01L 21/32134 |
| 2024/0170449 | A1 * | 5/2024 | Lee | H01L 25/0652 |
| 2024/0186277 | A1 * | 6/2024 | Park | H01L 24/13 |
| 2024/0194624 | A1 * | 6/2024 | Kim | H01L 23/481 |
| 2024/0203960 | A1 * | 6/2024 | Lee | H01L 24/08 |
| 2024/0243104 | A1 * | 7/2024 | Yeon | H01L 24/83 |
| 2024/0258278 | A1 * | 8/2024 | Shin | H01L 24/08 |
| 2025/0046757 | A1 * | 2/2025 | Chung | H01L 25/50 |
| 2025/0062210 | A1 * | 2/2025 | Kim | H01L 25/0655 |
| 2025/0079395 | A1 * | 3/2025 | Moon | H01L 24/83 |
| 2025/0087646 | A1 * | 3/2025 | Chung | H01L 23/49811 |
| 2025/0105182 | A1 * | 3/2025 | Park | H01L 24/06 |
| 2025/0132271 | A1 * | 4/2025 | Hwang | H10D 1/68 |
| 2025/0132275 | A1 * | 4/2025 | Cha | H01L 24/06 |
| 2025/0157980 | A1 * | 5/2025 | Seol | H01L 24/09 |
| 2025/0219000 | A1 * | 7/2025 | Kang | H01L 25/0657 |
| 2025/0226374 | A1 * | 7/2025 | Kwon | H01L 23/481 |

FOREIGN PATENT DOCUMENTS

| | | | | | |
|---|---|---|---|---|---|
| CN | 110277438 | A | * | 9/2019 | H10D 30/60 |
| CN | 110277438 | B | * | 7/2022 | H10D 30/60 |
| CN | 117457617 | A | * | 1/2024 | H01L 25/0657 |
| CN | 117637626 | A | * | 3/2024 | H01L 23/5283 |
| DE | 102014107018 | A1 | * | 11/2015 | H01L 25/0657 |
| EP | 4333033 | A1 | * | 3/2024 | H01L 22/32 |
| JP | 3750468 | B2 | * | 3/2006 | |
| JP | 4415443 | B2 | * | 2/2010 | |
| JP | 2015018899 | A | * | 1/2015 | |
| KR | 20120057693 | A | * | 6/2012 | H01L 25/18 |
| KR | 10 2012 0093770 | A | | 8/2012 | |
| KR | 20170061468 | A | * | 6/2017 | H01L 25/50 |
| KR | 10 2020 0034895 | A | | 4/2020 | |
| KR | 10 2020 0113069 | A | | 10/2020 | |
| KR | 10 2021 0152243 | A | | 12/2021 | |
| KR | 10-2352677 | B1 | | 1/2022 | |
| KR | 102372300 | B1 | * | 3/2022 | H01L 25/105 |
| KR | 20240029425 | A | * | 3/2024 | H01L 24/09 |
| KR | 20240038343 | A | * | 3/2024 | H01L 24/73 |
| KR | 20240044295 | A | * | 4/2024 | H01L 24/14 |
| KR | 20240062200 | A | * | 5/2024 | H01L 24/08 |
| KR | 20240075020 | A | * | 5/2024 | H01L 23/5389 |
| KR | 20240075050 | A | * | 5/2024 | H01L 24/16 |
| KR | 20240121132 | A | * | 8/2024 | H01L 23/5286 |
| KR | 20240152586 | A | * | 10/2024 | H01L 24/48 |
| KR | 20250027471 | A | * | 2/2025 | H01L 23/3121 |
| KR | 20250070678 | A | * | 5/2025 | H01L 23/53219 |
| KR | 102879035 | B1 | * | 10/2025 | H01L 23/5386 |
| TW | 202416458 | A | * | 4/2024 | H01L 23/3171 |
| WO | WO-0233750 | A1 | * | 4/2002 | H01L 24/29 |

* cited by examiner

SEMICONDUCTOR PACKAGE AND METHOD OF FABRICATING THE SAME

CROSS-REFERENCE TO RELATED APPLICATION

This U.S. nonprovisional application is based on and claims priority under 35 U.S.C § 119 to Korean Patent Application No. 10-2022-0155555 filed on Nov. 18, 2022 in the Korean Intellectual Property Office, the disclosure of which is hereby incorporated by reference in its entirety.

BACKGROUND

The present disclosure relates to a semiconductor package and a method of fabricating the same, and more particularly, to a stacked semiconductor package in which a plurality of chips are stacked on a substrate and a method of fabricating the same.

With the development of electronic industry, electronic products have increasingly demands for high performance, high speed, and compact size. To meet the trend, there has recently been developed a packaging technology in which a plurality of semiconductor chips are mounted in a single package.

Portable devices have been increasingly demanded in recent electronic product markets, and as a result, it has been ceaselessly required for reduction in size and weight of electronic parts mounted on the portable devices. In order to accomplish the reduction in size and weight of the electronic parts, there is need for technology to integrate a number of individual devices into a single package as well as technology to reduce individual sizes of mounting parts. A large number of adhesive members are used to attach a plurality of devices to each other, and various problems occur due to an increase in the number of the adhesive members.

SUMMARY

It is an aspect to provide a semiconductor package with improved structural stability and a method of fabricating the same.

It is another aspect to provide a method of fabricating a semiconductor package with reduced occurrence of defects and a semiconductor package fabricated by the same.

According to an aspect of some embodiments, there is provided a method comprising providing a first structure; forming a connection pad on the first structure; forming a preliminary connection member on the connection pad; forming an adhesion layer on the first structure, the adhesion layer covering the preliminary connection member; removing a portion of the adhesion layer to expose an exposure surface of the preliminary connection member; providing a second structure; forming a chip pad and a dummy pad on the second structure; and covering the chip pad and the dummy pad with the adhesion layer that has been formed on the first structure, wherein a thickness of the dummy pad is greater than a thickness of the chip pad.

According to another aspect of some embodiments, there is provide a method comprising providing a first structure; forming a connection pad on the first structure; forming a preliminary connection member on the connection pad; forming an adhesion layer on the first structure, the adhesion layer covering the preliminary connection member and including a curved part on the preliminary connection member; removing the curved part of the adhesion layer; and connecting the first structure to a second structure. Connecting the first structure to the second structure includes thermally compressing the adhesion layer against a dummy pad on the second structure; and forming a connection member by thermally compressing the preliminary connection member against a chip pad on the second structure.

According to yet another aspect of some embodiments, there is provided a method comprising providing a first structure on which is disposed a connection pad and a preliminary connection member is disposed on the connection pad; forming an adhesion layer on the first structure, the adhesion layer covering the preliminary connection member; removing a portion of the adhesion layer to expose an exposure surface of the preliminary connection member; providing a second structure; forming a chip pad and a dummy pad on the second structure; thermally compressing the adhesion layer and the dummy pad against each other; and thermally compressing the exposure surface of the preliminary connection member and the chip pad against each other, wherein the exposure surface and the chip pad are separated from each other while the adhesion layer and the dummy pad are thermally compressed against each other, and wherein a thickness of the dummy pad is greater than a thickness of the chip pad.

DETAILED DESCRIPTION

Aspects are not limited to the ones mentioned above, and other aspects and features which have not been mentioned above will be clearly understood to those skilled in the art from the following description.

The following will now describe a semiconductor package with reference to the accompanying drawings.

Figure 1:
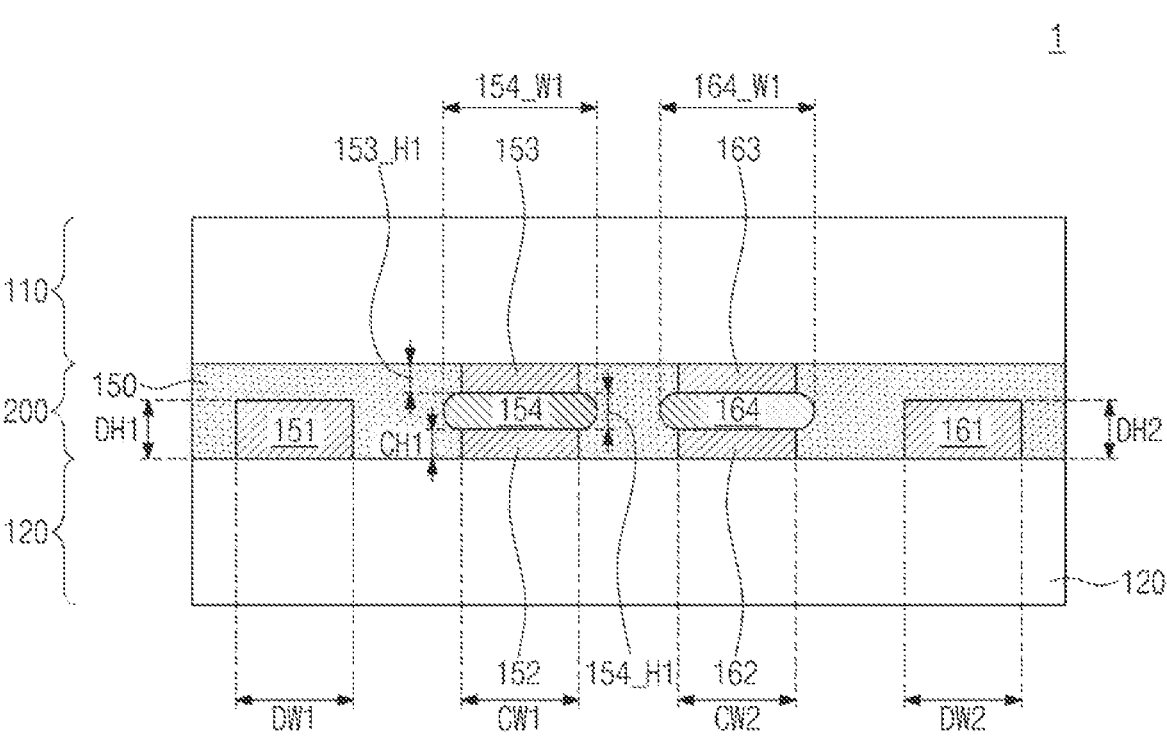
FIG. 1 illustrates a cross-sectional view showing a semiconductor package according to some embodiments.
Figure 1:
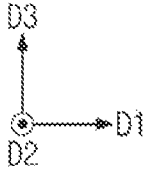

FIG. 1 illustrates a cross-sectional view showing a semiconductor package according to some embodiments.

Referring to FIG. 1, a semiconductor package 1 may include a first structure 110, a second structure 120, and a connection structure 200 between the first structure 110 and the second structure 120. The first structure 110 may be disposed over the second structure 120. The first structure 110 and the second structure 120 may be bonded to each other by the connection structure 200. The first structure 110 may be electrically connected to the second structure 120 through the connection structure 200.

The semiconductor package 1 may have a plate shape that extends along a plane defined by a first direction D1 and a second direction D2. The first direction D1 and the second direction D2 may intersect each other. For example, the direction D1 and the second direction D2 may be orthogonal to each other.

Each of the first structure 110 and the second structure 120 may be a semiconductor chip including a substrate and protection layers. Each of the first structure 110 and the second structure 120 may include a memory chip or a logic chip. The protection layers may protect the substrate. The substrate may be, for example, a silicon substrate. The protection layers may include a dielectric material. In some embodiments, each of the first structure 110 and the second structure 120 may further include a through silicon via (TSV). In some embodiments, the first structure 110 may be a redistribution substrate or a printed circuit board. In some embodiments, the second structure 120 may be a redistribution substrate or a printed circuit board.

The connection structure 200 may be provided on the second structure 120. The connection structure 200 may bond the first structure 110 and the second structure 120 to each other. The connection structure 200 may include a first dummy pad 151, a second dummy pad 161, an adhesion layer 150, a first chip pad 152, a second chip pad 162, a first connection pad 153, a second connection pad 163, a first connection member 154 between the first chip pad 152 and the first connection pad 153, and a second connection member 164 between the second chip pad 162 and the second connection pad 163.

The adhesion layer 150 may be provided between the first structure 110 and the second structure 120. The adhesion layer 150 may include a dielectric material. The adhesion layer 150 may include a non-conductive film (NCF).

The first dummy pad 151 may be provided on the second structure 120. The second dummy pad 161 may be provided on the second structure 120. The first chip pad 152 may be provided on the second structure 120. The second chip pad 162 may be provided on the second structure 120. The first chip pad 152 and the second chip pad 162 may be disposed between the first dummy pad 151 and the second dummy pad 161. The first dummy pad 151, the second dummy pad 161, the first chip pad 152, and the second chip pad 162 may include a conductive material.

The first chip pad 152 and the second chip pad 162 may be electrically connected to the second structure 120. The first dummy pad 151 and the second dummy pad 161 may be electrically separated from the second structure 120.

The first connection member 154 may be provided on the first chip pad 152. The second connection member 164 may be provided on the second chip pad 162. In some embodiments, a boundary line may be present between the first connection member 154 and the first chip pad 152. In some embodiments, a grain boundary may be provided between the first connection member 154 and the first chip pad 152. The first connection pad 153 may be disposed on the first connection member 154. The second connection pad 163 may be disposed on the second connection member 164. The first and second connection members 154 and 164 and the first and second connection pads 153 and 163 may include a conductive material.

The adhesion layer 150 may surround top and lateral surfaces of the first dummy pad 151. The adhesion layer 150 may surround top and lateral surfaces of the second dummy pad 161. The first dummy pad 151 and the second dummy pad 161 may be attached and fixed to the adhesion layer 150. A lateral surface of the first chip pad 152 may be in contact with the adhesion layer 150. A lateral surface of the second chip pad 162 may be in contact with the adhesion layer 150. A top surface of the first chip pad 152 may be in contact with a bottom surface of the first connection member 154. A top surface of the second chip pad 162 may be in contact with a bottom surface of the second connection member 164. A top surface of the first connection member 154 may be in contact with a bottom surface of the first connection pad 153. A top surface of the second connection member 164 may be in contact with a bottom surface of the second connection pad 163. A lateral surface of the first connection pad 153 may be in contact with the adhesion layer 150. A lateral surface of the second connection pad 163 may be in contact with the adhesion layer 150.

The adhesion layer 150 may have a melting point different from a melting point of the first connection member 154 and different from a melting point of the second connection member 164. The melting point of the adhesion layer 150 may be lower than the melting points of the first and second connection members 154 and 164. The melting point of the adhesion layer 150 may be different from a melting point of the first chip pad 152 and different from a melting point of the first connection pad 153. The melting point of the adhesion layer 150 may be different from a melting point of the second chip pad 162 and different from a melting point of the second connection pad 163. The melting point of the adhesion layer 150 may be lower than the melting points of the first and second chip pads 152 and 162 and lower than the melting points of the first and second connection pads 153 and 163.

The first dummy pad 151 may have a thickness DH1 less than a sum of a thickness CH1 of the first chip pad 152, a thickness 153_H1 of the first connection pad 153, and a thickness 154_H1 of the first connection member 154. The thickness DH1 of the first dummy pad 151 may be equal to or less than twice the thickness 153_H1 of the first connection pad 153. The thickness DH1 of the first dummy pad 151 may be equal to or less than twice the thickness CH1 of the first chip pad 152. The thickness CH1 of the first chip pad 152 may range, for example, from about 2 μm to about 5 μm. The thickness DH1 of the first dummy pad 151 may be greater than about 2 μm and less than about 10 μm. Because the thickness DH1 of the first dummy pad 151 is equal to or less than twice the thickness CH1 of the first chip pad 152, even when the thickness 154_H1 of the first connection member 154 is relatively small, the top surface of the first dummy pad 151 may not be in contact with a bottom surface of the first structure 110. The second dummy pad 161, the second chip pad 162, and the second connection member 164 may have structures similar to structures of the first dummy pad 151, the first chip pad 152, and the first connection member 154, respectively. In some embodiments, the thickness DH1 of the first dummy pad 151 may be the same as a thickness DH2 of the second dummy pad 161.

The first connection member 154 may have a maximum protrusion width 154_W1 greater than a width CW1 of the first chip pad 152. In some embodiments, the first dummy pad 151 may have a width DW1 different from the width CW1 of the first chip pad 152. In some embodiments, the first dummy pad 151 may have a width DW1 the same as the width CW1 of the first chip pad 152.

The second connection member 164 may have a maximum protrusion width 164_W1 greater than a width CW2 of the second chip pad 162. In some embodiments, the second dummy pad 161 may have a width DW2 different from the width CW2 of the second chip pad 162. In some embodiments, the second dummy pad 161 may have a width DW2 the same as the width CW2 of the second chip pad 162.

The first connection pad 153 and the second connection pad 163 may be electrically connected to the first structure 110. The first structure 110, the connection structure 200, and the second structure 120 may be electrically connected through the first and second connection members 154 and 164, the first and second connection pads 153 and 163, and the first and second chip pads 152 and 162.

Since the first dummy pad 151 and the second dummy pad 161 have thicknesses greater than a thickness of the first chip pad 152, and since the first dummy pad 151 and the second dummy pad 161 are attached to the adhesion layer 150, no misalignment may be produced between the first chip pad 152, the first connection member 154, and the first connection pad 153.

FIGS. 2A, 2B, 2C, 2D, and 2E illustrate cross-sectional views showing a method of fabricating a semiconductor package according to some embodiments.

Figure 2A:
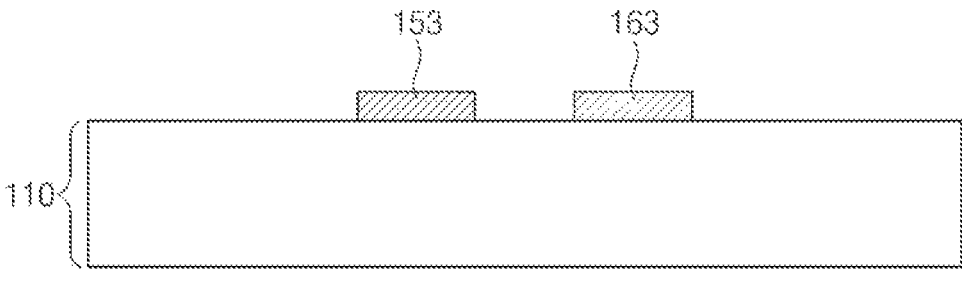
FIGS. 2A, 2B, 2C, 2D, and 2E illustrate cross-sectional views showing a method of fabricating a semiconductor package according to some embodiments.
Figure 2A:
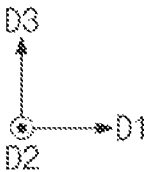

Referring to FIG. 2A, a first structure 110 may be provided. A first connection pad 153 and a second connection pad 163 may be formed on the first structure 110.

Figure 2B:
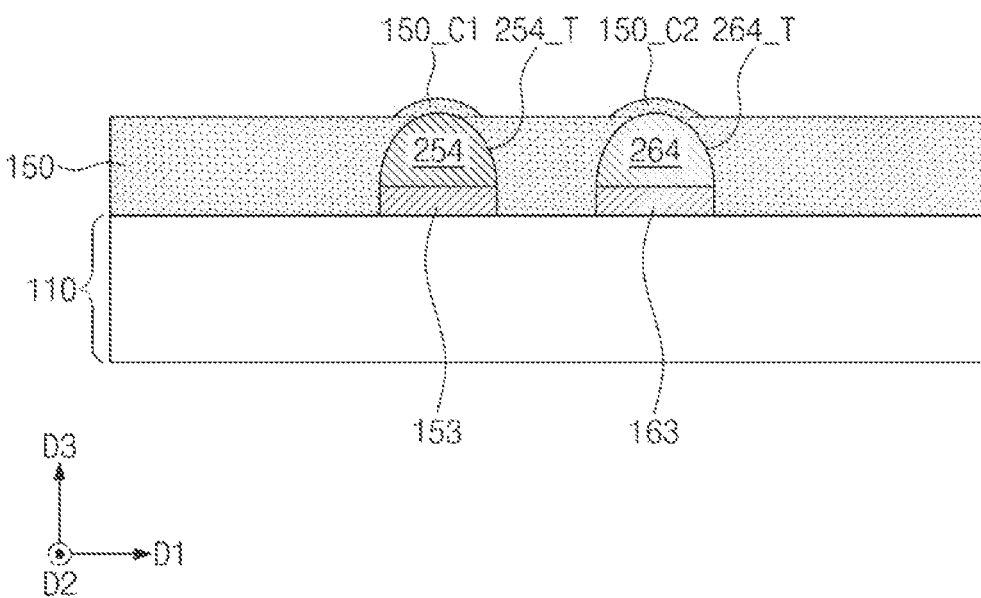

Referring to FIG. 2B, a first preliminary connection member 254 may be formed on the first connection pad 153. A second preliminary connection member 264 may be formed on the second connection pad 163. An adhesion layer 150 may be formed on the first structure 110. The adhesion layer 150 may be provided to cover the first preliminary connection member 254 and the second preliminary connection member 264. The first preliminary connection member 254 may have a surface 254_T covered with the adhesion layer 150, and the second preliminary connection member 264 may have a surface 264_T covered with the adhesion layer 150.

The adhesion layer 150 may include a first curved part 150_C1 on the first preliminary connection member 254 and a second curved part 150_C2 on the second preliminary connection member 264. The first and second curved parts 150_C1 and 150_C2 of the adhesion layer 150 may have respective top surfaces that are curved corresponding respectively to surfaces 254_T and 264_T of the first and second preliminary connection members 254 and 264. The first and second curved parts 150_C1 and 150_C2 of the adhesion layer 150 may be located at a higher level than a level of a top surface of the adhesion layer 150 at locations not corresponding to the locations of the first and second connection pads 153 and 163.

Figure 2C:
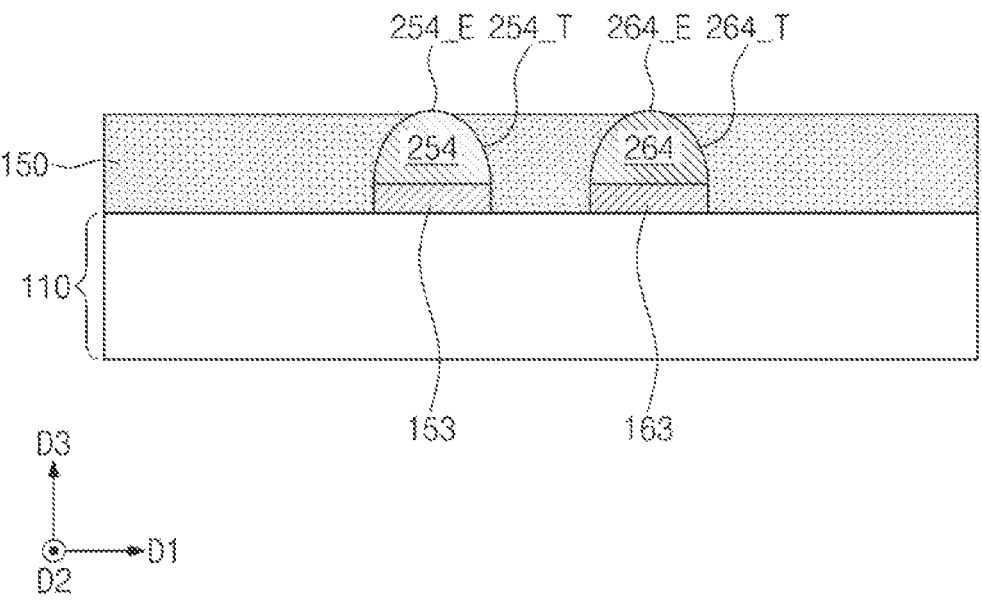

Referring to FIG. 2C, a portion of the adhesion layer 150 may be removed. The first and second curved parts 150_C1 and 150_C2 may be removed. A portion of the adhesion layer 150 may be removed to expose a portion of the surface 254_T of the first preliminary connection member 254 and a portion of the surface 264_T of the second preliminary connection member 264. A first exposure surface 254_E may be defined to refer to the exposed portion of the surface 254_T of the first preliminary connection member 254, and a second exposure surface 264_E may be defined to refer to the exposed portion of the surface 264_T of the second preliminary connection member 264.

Figure 2D:
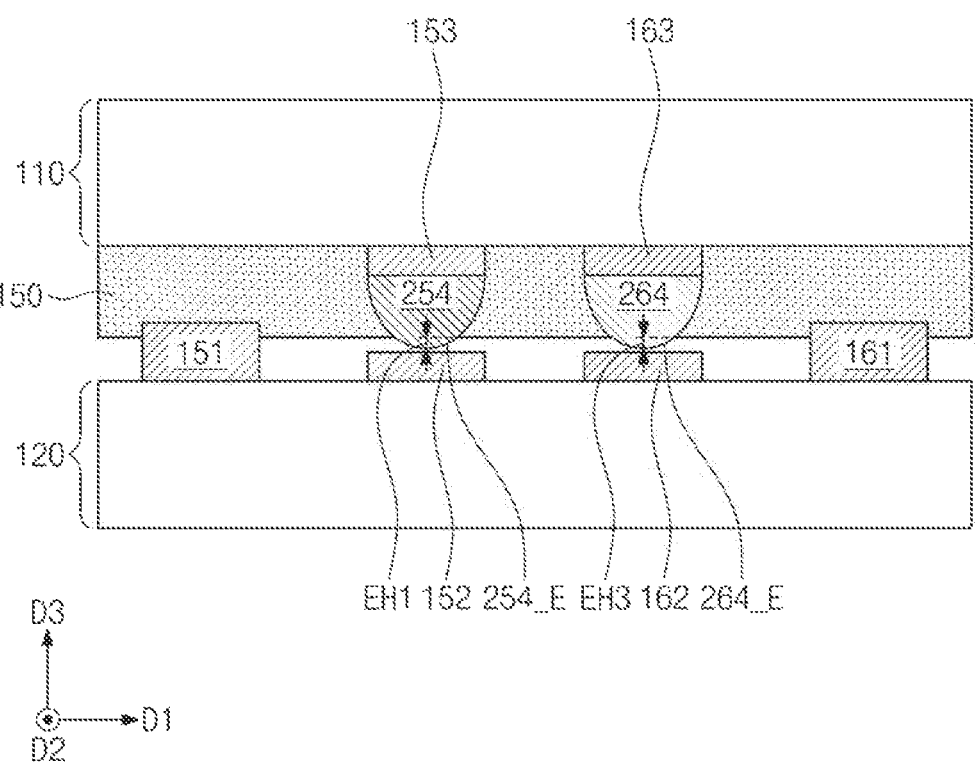

Referring to FIG. 2D, a second structure 120 may be provided. A first chip pad 152 and a second chip pad 162 may be formed on the second structure 120. A first dummy pad 151 and a second dummy pad 161 may be formed on the second structure 120. The first and second dummy pads 151 and 161 may each have a thickness greater than thicknesses of each of the first and second chip pads 152 and 162. The first structure 110 and the second structure 120 may be connected through a thermocompression process. The second structure 120 may be connected to the adhesion layer 150 and to the first and second preliminary connection members 254 and 264 on the first structure 110. That is, the second structure 120 having the first and second dummy pads 151 and 161 thereon may be connected to the adhesion layer 150 and to the first and second preliminary connection members 254 and 264 on the first structure 110.

The first and second dummy pads 151 and 161 may be thermally compressed and bonded to the adhesion layer 150. The first and second dummy pads 151 and 161 may be in direct contact with the adhesion layer 150. The first and second dummy pads 151 and 161 may be thermally compressed against the adhesion layer 150. The first and second dummy pads 151 and 161 and the adhesion layer 150 may be thermally compressed at a temperature of, for example, about 80° C. to about 150° C. The first and second dummy pads 151 and 161 and the adhesion layer 150 may be thermally compressed at a pressure, for example, of about 10 N/m² to about 150 N/m². Even when the first dummy pad 151 and the adhesion layer 150 are bonded to each other, the first preliminary connection member 254 and the first chip pad 152 may be spaced apart from each other without being in contact with each other. The first dummy pad 151 may have a thickness greater than a sum of a thickness of the first chip pads 152 and a thickness EH1 of an exposed portion of the first preliminary connection member 254. Since the first dummy pad 151 and the adhesion layer 150 are in contact with each other, a fixed alignment may be produced among the first preliminary connection member 254, the first chip pad 152, and the first connection pad 153.

Figure 2E:
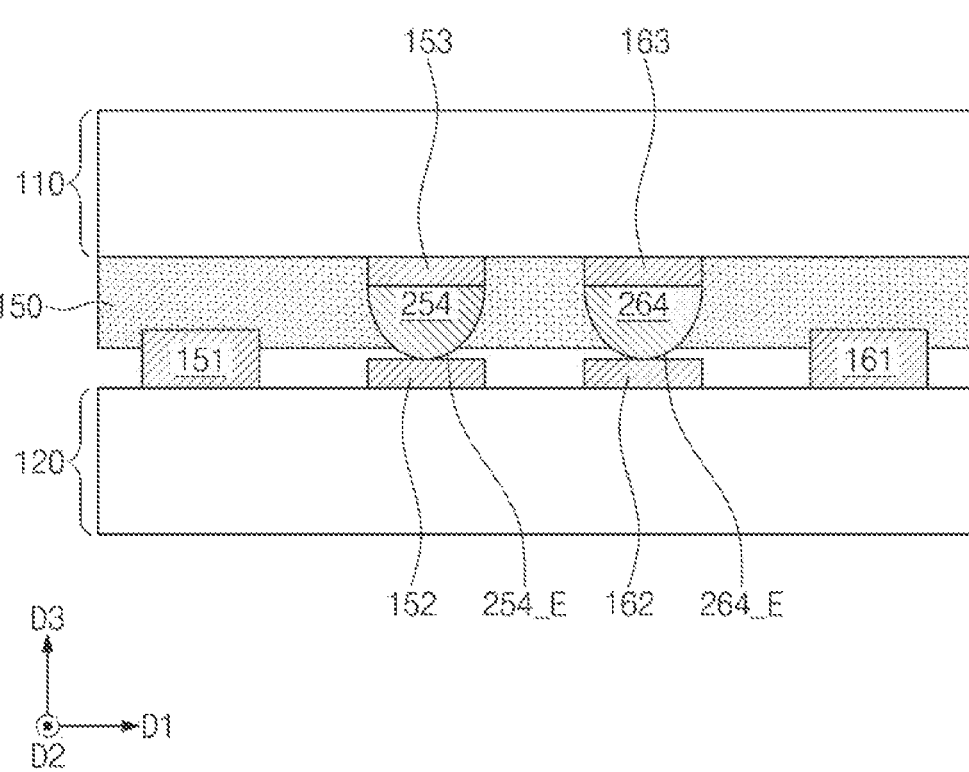

Referring to FIGS. 1 and 2E, the first preliminary connection member 254 may be thermally compressed against the first chip pad 152, and the second preliminary connection member 264 may be thermally compressed against the second chip pad 162. A thermocompression temperature between the first and second preliminary connection members 254 and 264 and the first and second chip pads 152 and 162 may be greater than a thermocompression temperature between the first and second dummy pads 151 and 161 and the adhesion layer 150. A thermocompression pressure of the first and second preliminary connection members 254 and 264 against the first and second chip pads 152 and 162 may be greater than a thermocompression pressure of the first and second dummy pads 151 and 161 against the adhesion layer 150.

A temperature of about 250° C. to about 400° C. may be given as the thermocompression temperature between the first and second preliminary connection members 254 and 264 and the first and second chip pads 152 and 162. A pressure of about 10 N/m² to about 400 N/m² may be given as the thermocompression pressure of the first and second preliminary connection members 254 and 264 against the first and second chip pads 152 and 162. The first dummy pad 151 and the adhesion layer 150 may contact each other to achieve thermocompression contact between the first preliminary connection member 254 and the first chip pad 152 that are spaced apart from each other under a state of fixed alignment among the first preliminary connection member 254, the first chip pad 152, and the first connection pad 153. Because there is a fixed alignment between the first preliminary connection member 254, the first chip pad 152, and the first connection pad 153, the first preliminary connection member 254 and the first chip pad 152 may be thermally compressed against each other in an exact position. Because the first exposure surface 254_E of the first preliminary connection member 254 is exposed, the first preliminary connection member 254 may be in direct contact with the first chip pad 152. Because the first exposure surface 254_E of the first preliminary connection member 254 is exposed, no foreign substance may be introduced when the first preliminary connection member 254 is in contact with the first chip pad 152. A first connection member 154 may be formed when the first exposure surface 254_E of the first preliminary connection member 254 is in contact with and thermally compressed against the first chip pad 152. The adhesion layer 150 and the second structure 120 may be thermally compressed against each other. Accordingly, the first structure 110 and the second structure 120 may be connected to each other.

Figure 3:
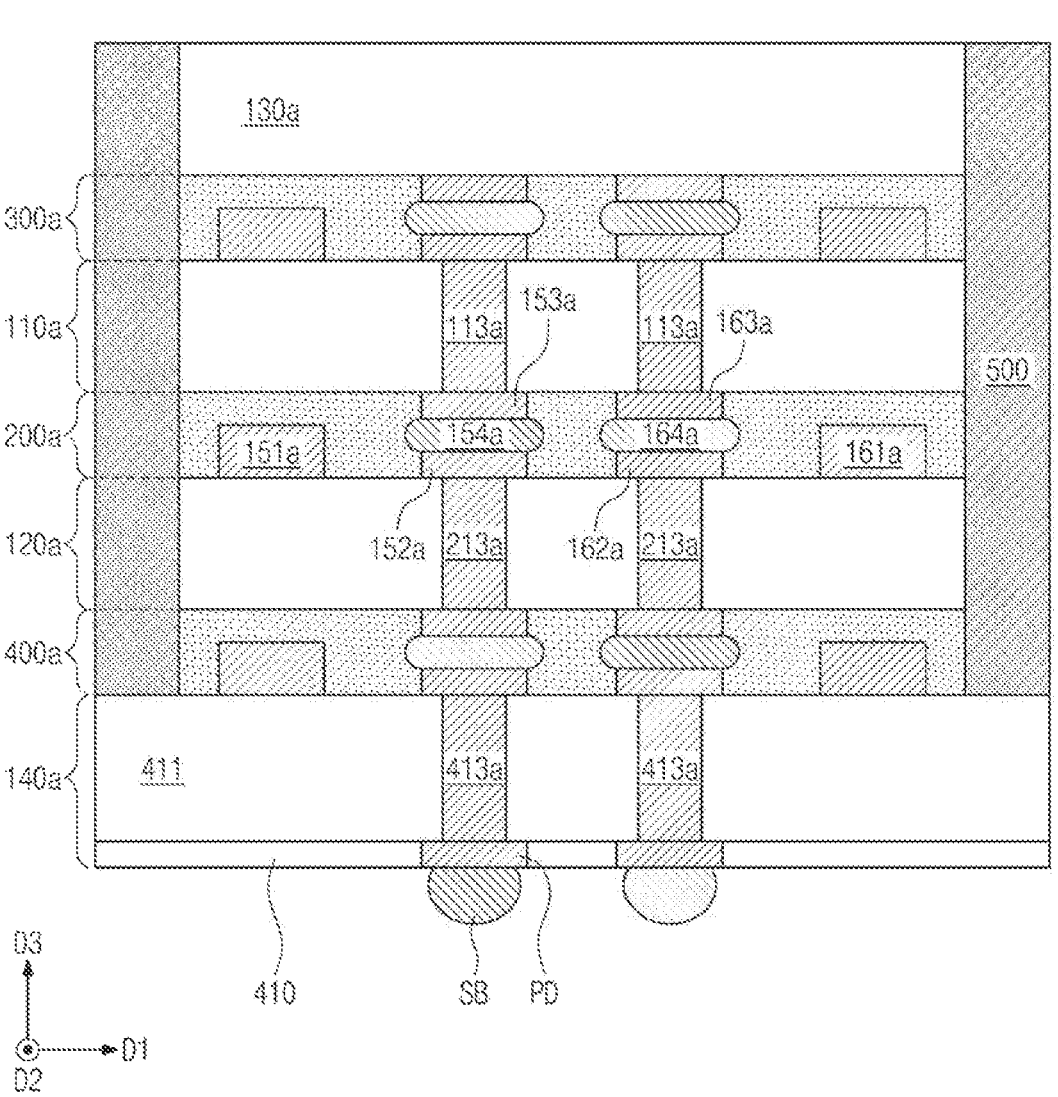
FIG. 3 illustrates a cross-sectional view showing a semiconductor package according to some embodiments.

FIG. 3 illustrates a cross-sectional view showing a semiconductor package according to some embodiments.

Referring to FIG. 3, a semiconductor package 2 may include a first structure 110*a*, a second structure 120*a*, a third structure 130*a*, a fourth structure 140*a*, a first connection structure 200*a* between the first structure 110*a* and the second structure 120*a*, a second connection structure 300*a* between the first structure 110*a* and the third structure 130*a*, a third connection structure 400*a* between the fourth structure 140*a* and the second structure 120*a*, a solder ball SB, and a mold layer 500. The first connection structure 200*a*, the second connection structure 300*a*, and the third connection structure 400*a* may each correspond to the first connection structure 200 described above with respect to FIGS. 1 to 2E.

The second structure 120*a* may be disposed over the fourth structure 140*a*. The first structure 110*a* may be disposed over the second structure 120*a*. The third structure 130*a* may be disposed over the first structure 110*a*.

The first structure 110*a* may be bonded to the second structure 120*a* by the first connection structure 200*a*. The first structure 110*a* and the second structure 120*a* may be electrically connected to each other through the first connection structure 200*a*. The first structure 110*a* may be bonded to the third structure 130*a* by the second connection structure 300*a*. The first structure 110*a* and the third structure 130*a* may be electrically connected to each other through the second connection structure 300*a*. The fourth structure 140*a* may be bonded to the second structure 120*a* by the third connection structure 400*a*. The fourth structure 140*a* and the second structure 120*a* may be electrically connected to each other through the third connection structure 400*a*.

The first structure 110*a* may further include a first through structure 113*a* that penetrates the first structure 110*a*. The first through structure 113*a* may be provided in plural.

The second structure 120*a* may further include a second through structure 213*a* that penetrates the second structure 120*a*. The second through structure 213*a* may be provided in plural.

The fourth structure 140*a* may include a resist layer 410, a base substrate 411 on the resist layer 410, and a pad PD that penetrates the resist layer 410.

The solder ball SB may be provided on the pad PD.

The fourth structure 140*a* may further include a fourth through structure 413*a* that penetrates the fourth structure 140*a*. The fourth through structure 413*a* may be provided in plural.

The first connection structure 200*a* may have a structure similar to a structure of the first connection structure 200 described above with reference to FIGS. 1 to 2E. The first connection structure 200*a* may be provided on the second structure 120*a*. The first connection structure 200*a* may bond the first structure 110*a* to the second structure 120*a*. The first connection structure 200*a* may include a first dummy pad 151*a*, a second dummy pad 161*a*, a first adhesion layer 150*a*, a first chip pad 152*a*, a second chip pad 162*a*, a first connection pad 153*a*, a second connection pad 163*a*, a first connection member 154*a* between the first chip pad 152*a* and the first connection pad 153*a*, and a second connection member 164*a* between the second chip pad 162*a* and the second connection pad 163*a*.

The first chip pad 152*a* and the second chip pad 162*a* may be disposed between the first dummy pad 151*a* and the second dummy pad 161*a*. The first connection member 154*a* may be disposed on the first chip pad 152*a*. The first connection pad 153*a* may be disposed on the first connection member 154*a*.

The second connection structure 300*a* may be provided on the first structure 110*a*. The second connection structure 300*a* may bond the first structure 110*a* to the third structure 130*a*. The second connection structure 300*a* may have a structure similar to a structure of the first connection structure 200*a*. The third connection structure 400*a* may be provided on the fourth structure 140*a*. The third connection structure 400*a* may bond the fourth structure 140*a* to the second structure 120*a*. The third connection structure 400*a* may have a structure similar to a structure of the second connection structure 300*a*.

The mold layer 500 may be provided on the fourth structure 140*a*. The mold layer 500 may include a polymeric material. The mold layer 500 may surround the first, second, and third structures 110*a*, 120*a*, and 130*a*.

Figure 4:
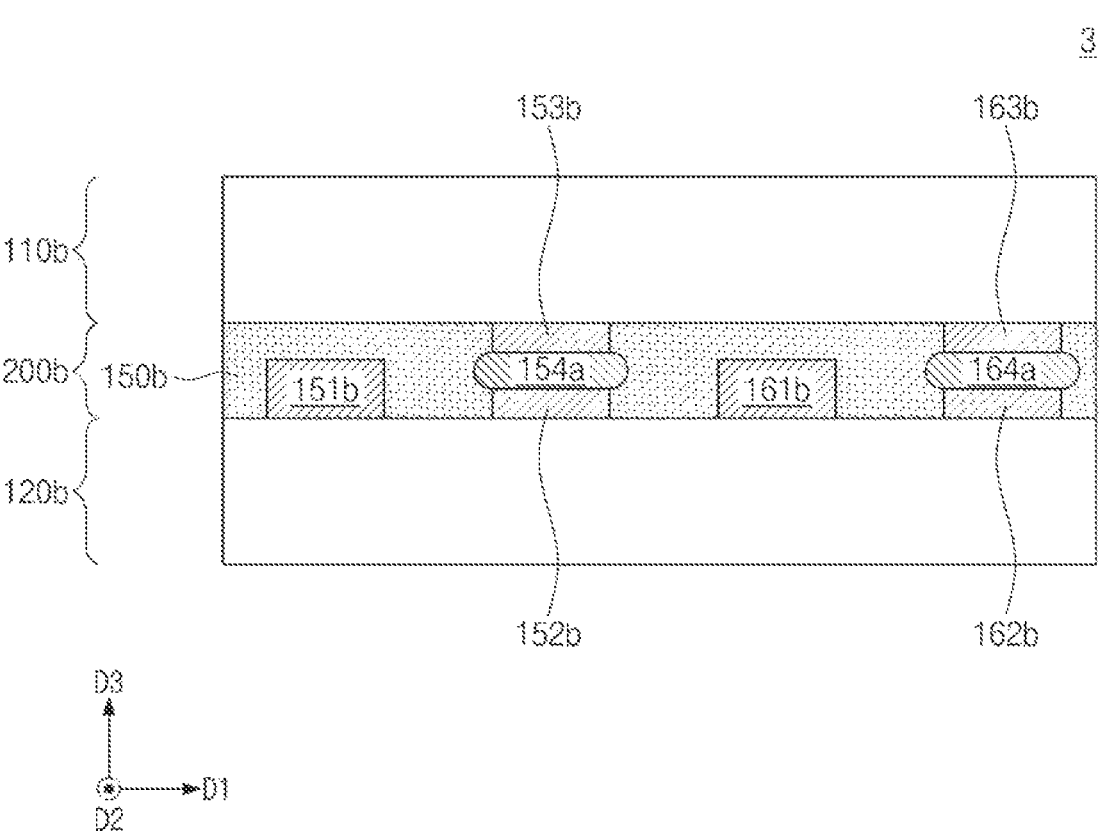
FIG. 4 illustrates a cross-sectional view showing a semiconductor package according to some embodiments.

FIG. 4 illustrates a cross-sectional view showing a semiconductor package according to some embodiments.

Referring to FIG. 4, a semiconductor package 3 may include a first structure 110*b*, a second structure 120*b*, and a connection structure 200*b* between the first structure 110*b* and the second structure 120*b*. The first structure 110*b* may be bonded to the second structure 120*b* by the connection structure 200*b*. The first structure 110*b* and the second structure 120*b* may be electrically connected to each other through the connection structure 200*b*. The connection structure 200*b* may be provided on the second structure 120*b*. The connection structure 200*b* may bond the first structure 110*b* to the second structure 120*b*. The connection structure 200*b* may include a first dummy pad 151*b*, a second dummy pad 161*b*, a first adhesion layer 150*b*, a first chip pad 152*b*, a second chip pad 162*b*, a first connection pad 153*b*, a second connection pad 163*b*, a first connection member 154*b* between the first chip pad 152*b* and the first connection pad 153*b*, and a second connection member 164*b* between the second chip pad 162*b* and the second connection pad 163*b*.

The second structure 120*b* may be provided thereon with the first dummy pad 151*b*, the first chip pad 152*b*, the second dummy pad 161*b*, and a second chip pad 162*b* that are disposed spaced apart from each other in the first direction D1. The first chip pad 152*b* may be disposed between the first dummy pad 151*b* and the second dummy pad 161*b*. The second dummy pad 161*b* may be disposed between the first chip pad 152*b* and the second chip pad 162*b*.

Figure 5:
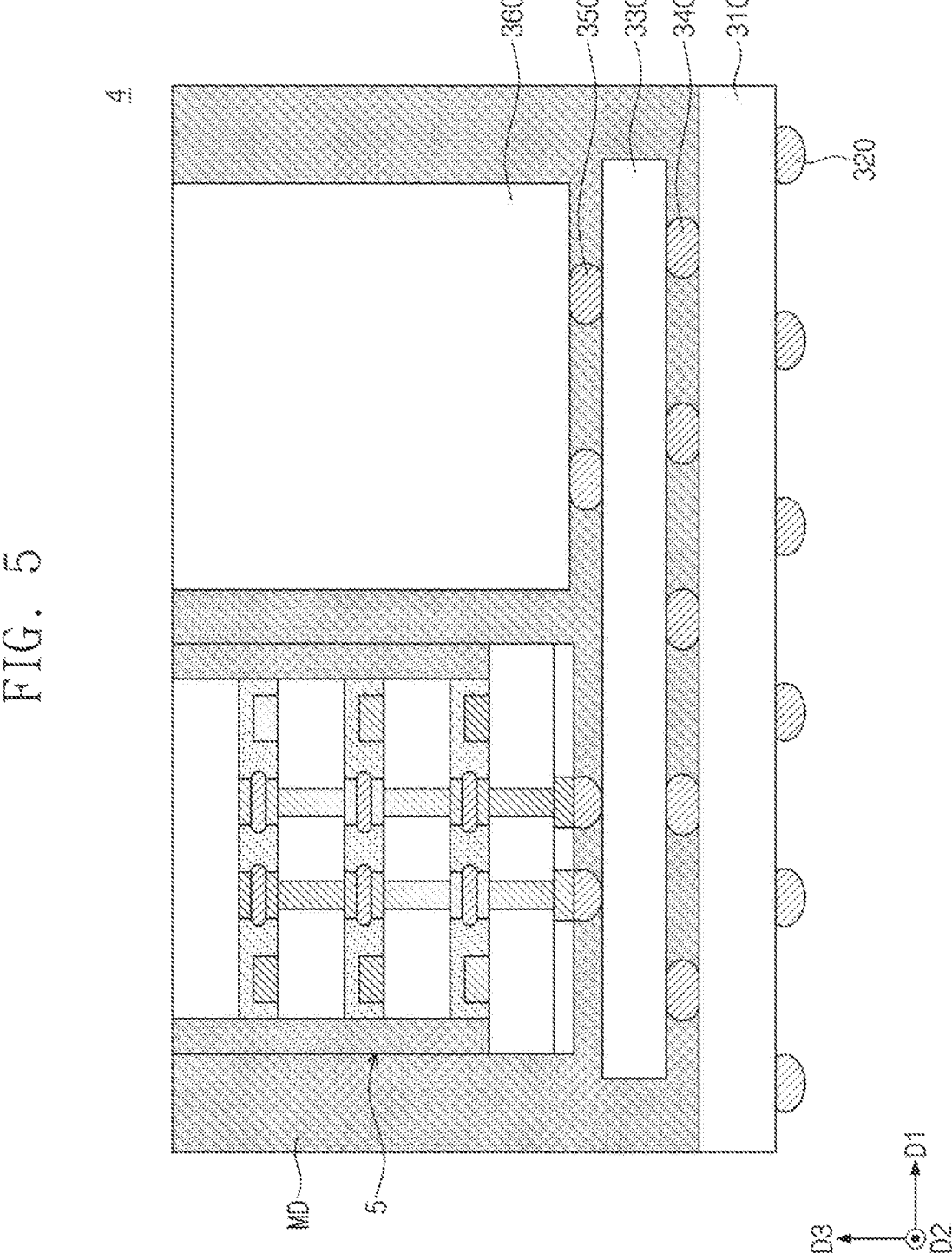
FIG. 5 illustrates a cross-sectional view showing a semiconductor package according to some embodiments.

FIG. 5 illustrates a cross-sectional view showing a semiconductor package according to some embodiments.

Referring to FIG. 5, a semiconductor package 4 may include a package substrate 310. First terminals 320 may be provided which are electrically connected to the package substrate 310. The semiconductor package 4 may be mounted through the first terminals 320 on an external apparatus (e.g., main board).

An interposer 330 may be provided on the package substrate 310. Second terminals 340 may be provided to electrically connect the package substrate 310 to the interposer 330. The second terminals 340 may be provided between the package substrate 310 and the interposer 330.

A processor chip 360 may be provided on the interposer 330. For example, the processor chip 360 may be a graphic processing unit (GPU) or a central processing unit (CPU). Third terminals 350 may be provided to electrically connect the processor chip 360 to the interposer 330. The third terminals 350 may be provided between the processor chip 360 and the interposer 330.

A semiconductor package 5 may be provided on the interposer 330. The semiconductor package 5 may be similar to the semiconductor package 2 discussed in FIG. 3. The semiconductor package 5 may be spaced apart in the first direction D1 from the processor chip 360.

The package substrate 310 may be provided thereon with a mold layer MD that surrounds the interposer 330, the processor chip 360, and the semiconductor package 5.

In a semiconductor package and its fabrication method according to some embodiments, a process may be performed to remove an adhesion layer that covers a surface of a connection member when a plurality of chips are stacked, and thus the adhesion layer may be prevented from being introduced between the connection member and a pad In a semiconductor package and its fabrication method according to some embodiments, before the connection member is formed, the adhesion layer may be thermally compressed against a dummy pad having a thickness greater than that of a chip pad, and thus it may be possible to prevent misalignment between the chips.

Although various embodiments have been described with reference to the accompanying drawings, it will be understood by one of ordinary skill in the art that variations in form and detail may be made therein without departing from the spirit and scope of the present disclosure. The above disclosed embodiments should thus be considered illustrative and not restrictive.

What is claimed is:

1. A method comprising:
providing a first structure;
forming a connection pad on the first structure;
forming a preliminary connection member on the connection pad;
forming an adhesion layer on the first structure, the adhesion layer covering the preliminary connection member;
removing a portion of the adhesion layer to expose an exposure surface of the preliminary connection member;
providing a second structure;
forming a chip pad and a dummy pad on the second structure; and
covering the chip pad and the dummy pad with the adhesion layer that has been formed on the first structure,
wherein a thickness of the dummy pad is greater than a thickness of the chip pad.

2. The method of claim 1, wherein the covering includes:
contacting the adhesion layer to the dummy pad; and
contacting the exposure surface of the preliminary connection member with the chip pad to form a connection member.

3. The method of claim 2, wherein contacting the adhesion layer to the dummy pad includes thermally compressing the adhesion layer against the dummy pad.

4. The method of claim 2, wherein contacting the adhesion layer to the dummy pad includes contacting the adhesion layer to the dummy pad while the preliminary connection member is maintained separated from the chip pad.

5. The method of claim 1, wherein:
the dummy pad comprises a plurality of dummy pads, and
each of the plurality of dummy pads has a same thickness.

6. The method of claim 1, wherein the first structure includes a through structure that penetrates the first structure,
wherein the through structure, the connection pad, and the preliminary connection member are electrically connected to each other.

7. The method of claim 1, wherein the thickness of the dummy pad is equal to or less than twice the thickness of the chip pad.

8. The method of claim 1, wherein:
the dummy pad includes a first dummy pad and a second dummy pad,
the connection pad includes a first connection pad and a second connection pad, and
the first connection pad is between the first dummy pad and the second dummy pad.

9. The method of claim 1, wherein covering the chip pad and the dummy pad with the adhesion layer includes thermally compressing and bonding the adhesion layer and the dummy pad,
wherein the adhesion layer and the dummy pad are thermally compressed at a temperature greater than a melting point of the adhesion layer and less than a melting point of the preliminary connection member.

10. The method of claim 9, wherein the temperature at which the adhesion layer and the dummy pad are thermally compressed is about 80° C. to about 150° C.

11. A method comprising:
providing a first structure on which is disposed a connection pad and a preliminary connection member is disposed on the connection pad;
forming an adhesion layer on the first structure, the adhesion layer covering the preliminary connection member;
removing a portion of the adhesion layer to expose an exposure surface of the preliminary connection member;
providing a second structure;
forming a chip pad and a dummy pad on the second structure;
thermally compressing the adhesion layer and the dummy pad against each other; and
thermally compressing the exposure surface of the preliminary connection member and the chip pad against each other,
wherein the exposure surface and the chip pad are separated from each other while the adhesion layer and the dummy pad are thermally compressed against each other, and
wherein a thickness of the dummy pad is greater than a thickness of the chip pad.

* * * * *